(12) United States Patent
Sakui et al.

(10) Patent No.: US 9,007,831 B2
(45) Date of Patent: Apr. 14, 2015

(54) MEMORY DEVICES WITH DIFFERENT SIZED BLOCKS OF MEMORY CELLS AND METHODS

(71) Applicant: Micron Technology, Inc., Boise, ID (US)

(72) Inventors: Koji Sakui, Tokyo (JP); Peter Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 115 days.

(21) Appl. No.: 13/785,210

(22) Filed: Mar. 5, 2013

(65) Prior Publication Data

US 2014/0254267 A1    Sep. 11, 2014

(51) Int. Cl.
*G11C 16/04* (2006.01)
*G11C 16/10* (2006.01)

(52) U.S. Cl.
CPC .............. *G11C 16/10* (2013.01); *G11C 16/04* (2013.01)

(58) Field of Classification Search
CPC ......... G11C 16/08; G11C 16/10; G11C 16/16
USPC ............................ 365/185.11, 185.27, 230.03
See application file for complete search history.

(56) References Cited

U.S. PATENT DOCUMENTS

| | | | |
|---|---|---|---|
| 5,398,210 A * | 3/1995 | Higuchi | 365/230.03 |
| 5,805,510 A | 9/1998 | Miyakawa et al. | |
| 6,498,750 B2 * | 12/2002 | Terada | 365/185.11 |
| 6,738,290 B2 * | 5/2004 | Lee et al. | 365/185.17 |
| 7,177,191 B2 | 2/2007 | Fasoli et al. | |
| 7,542,343 B1 | 6/2009 | Kim | |
| 7,630,244 B2 * | 12/2009 | Lee | 365/185.17 |
| 7,791,952 B2 | 9/2010 | Roohparvar | |
| 7,881,094 B2 * | 2/2011 | Chen et al. | 365/148 |
| 7,929,372 B2 * | 4/2011 | Han et al. | 365/230.06 |
| 8,341,336 B2 * | 12/2012 | Chang et al. | 711/103 |

* cited by examiner

*Primary Examiner* — Connie Yoha
(74) *Attorney, Agent, or Firm* — Dicke, Billig & Czaja, PLLC

(57) ABSTRACT

In an embodiment, each block of a plurality of blocks includes a respective plurality of strings of memory cells, where each of the plurality of strings of a block is coupled to a respective select transistor, and wherein each of the select transistors coupled to the plurality of strings of the block is coupled to a common first select line. The plurality of blocks includes N block sizes, where N may be an integer greater than or equal to three. N−1 blocks of one block size of the N block sizes collectively include a first number of second select lines. A group of blocks consisting of a respective block of each remaining block size of the N block sizes collectively include a second number of second select lines that is equal to the first number of select lines or that is less than the first number of second select lines.

38 Claims, 11 Drawing Sheets

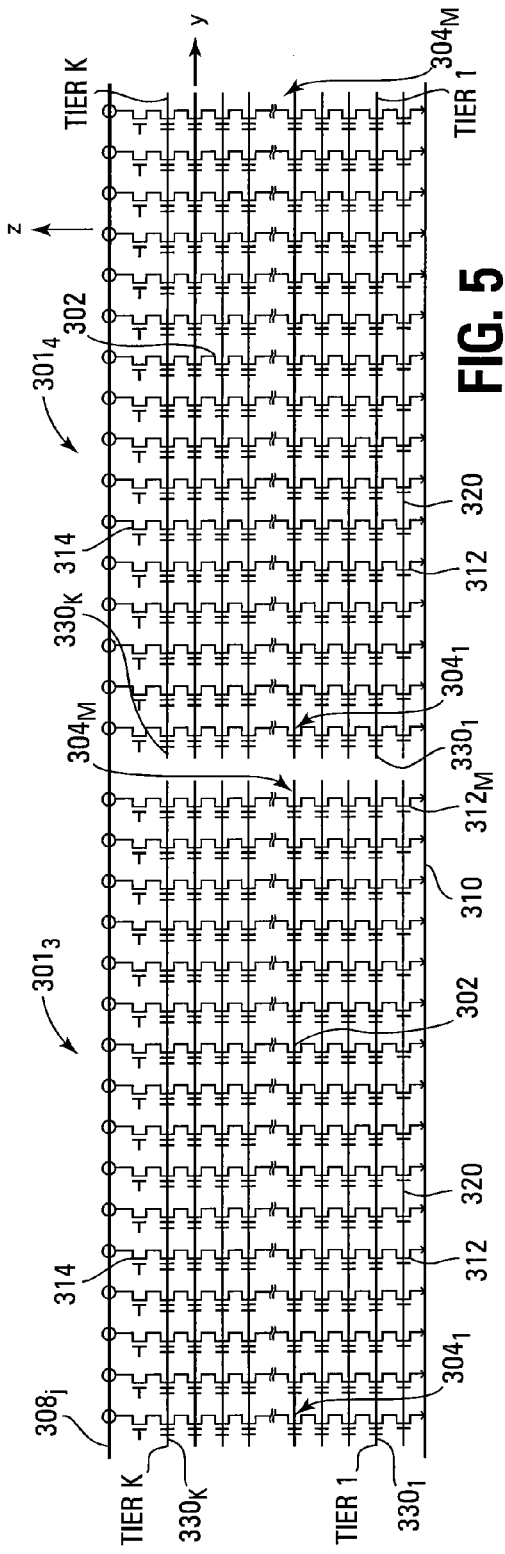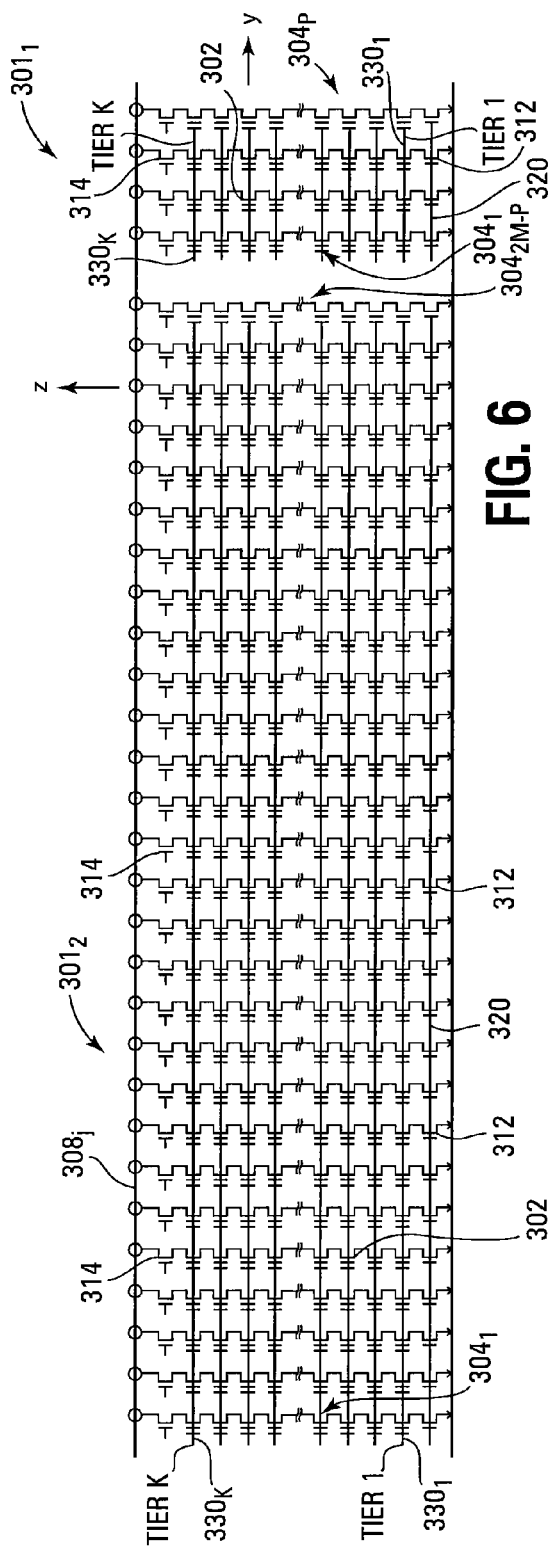

MEMORY DEVICES WITH DIFFERENT SIZED BLOCKS OF MEMORY CELLS AND METHODS

FIELD

The present disclosure relates generally to memory devices and in particular the present disclosure relates to memory devices with different sized blocks of memory cells and methods.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select transistors, e.g., a source select transistor and a drain select transistor. Each source select transistor is connected to a source line, while each drain select transistor is connected to a data line, such as column bit line. A "column" refers to a group of memory cells that are commonly coupled to a local data line, such as a local bit line. It does not require any particular orientation or linear relationship, but instead refers to the logical relationship between memory cell and data line.

To meet the demand for higher capacity memories, designers continue to strive for increasing memory density, i.e., the number of memory cells for a given area of an integrated circuit die. One way to increase the density of memory devices is to form stacked memory arrays, e.g., often referred to as three-dimensional memory arrays. For example, one type of three-dimensional memory array may include stacked memory cells, e.g., substantially vertical strings of series coupled memory cells, such as substantially vertical NAND strings, adjacent to pillars, such as substantially vertical semiconductor pillars. For example, the memory cells at a common location (e.g., at a common vertical elevation) in the strings may form a tier of memory cells that may be commonly coupled to a plate, such as a control-gate plate. However, the commonly coupled memory cells can slow access to the memory cells, e.g., when programming or reading the memory cells. A vertical direction may be defined, for example, as a direction that is perpendicular to a base structure, such as a surface of an integrated circuit die, and "substantially vertical" accounts for variations from vertical, e.g., due to routine process variations.

For the reasons stated above, and for other reasons stated below which will become apparent to those skilled in the art upon reading and understanding the present specification, there is a need in the art for alternative memory arrays.

BRIEF DESCRIPTION OF THE DRAWINGS

FIG. 5 is a schematic of a cross-section taken along line 5-5 in FIG. 3.

FIG. 6 is a schematic of a cross-section taken along lines 6-6 in FIG. 3.

DETAILED DESCRIPTION

Figure 1:
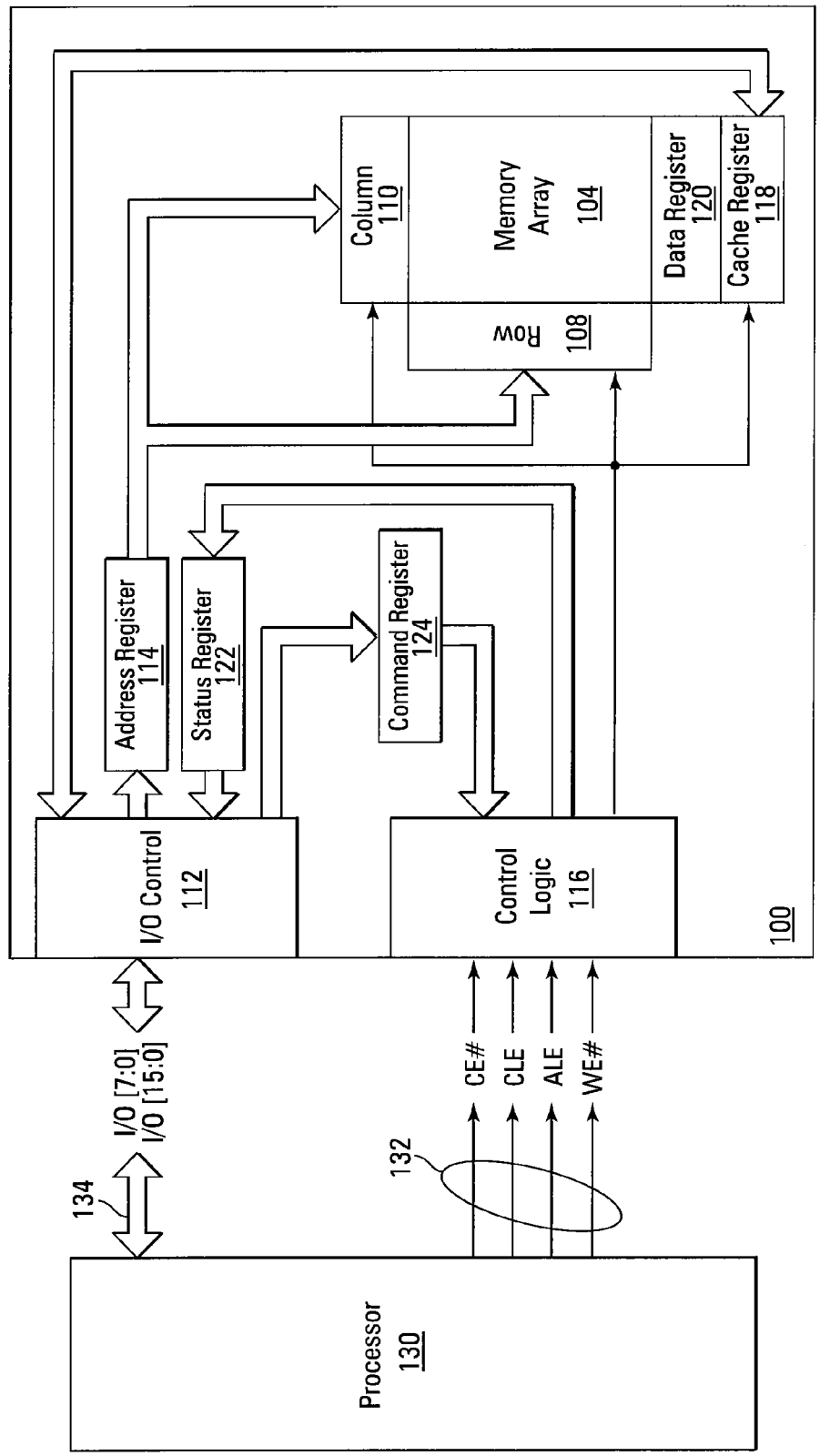
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

FIG. 1 is a simplified block diagram of an integrated circuit device, such as a NAND flash memory device 100, in communication with a processor 130 as part of an electronic system, according to an embodiment. The processor 130 may be a memory controller or other external host device.

Memory device 100 includes an array of memory cells 104 in accordance with embodiments of the disclosure. For example, memory array 104 might include memory cells organized in a plurality of blocks. Each block of the plurality of blocks includes a respective plurality of strings of memory cells, where each of the plurality of strings of memory cells of a block are coupled to a respective select transistor (e.g., a respective source select transistor), and wherein each of those select transistors are coupled to a common select line (e.g., a common source select line). The plurality of blocks might include a set of N block sizes, where N might be an integer value greater than or equal to three, for example. N–1 blocks of one block size of the set of N block sizes might collectively include a first number of select lines. A group of blocks consisting of a respective block of each remaining block size of the set of N block sizes might collectively include a second number of select lines that is equal to the first number of select lines or less than the first number of select lines.

A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

Control logic 116 may be configured to cause memory device 100 to perform methods, such as programming and reading memory array 104. For example, during an embodiment of a method of programming memory array 104, a voltage applied to a selected control-gate plate of a first block of memory cells might be increased from a first voltage to a second voltage, starting at a first initial time. The voltage applied to the selected control-gate plate of the first block of memory cells might then be increased from the second voltage to a program voltage, starting at a second time that is a first length of time after the first initial time. A voltage applied to a selected control-gate plate of a second block of memory cells might be increased from the first voltage to the second voltage, starting at a second initial time. The voltage applied to the selected control-gate plate of the second block of memory cells might then be increased from the second voltage to the program voltage, starting at a third time that is a second length of time after the second initial time, where the first length of time is shorter than the second length of time.

During an embodiment of a method of reading memory array 104, for example, a voltage applied to a selected control-gate plate of a first block of memory cells might be increased from a first voltage to a read voltage, starting at a first initial time. A sense amplifier latch may then be activated, starting at a second time that is a first length of time after the first initial time. A voltage applied to a selected control-gate plate of a second block of memory cells might be increased from the first voltage to the read voltage, starting at a second initial time. The sense amplifier latch may then be activated, starting at a third time that is a second length of time after the second initial time, where the first length of time is shorter than the second length of time.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
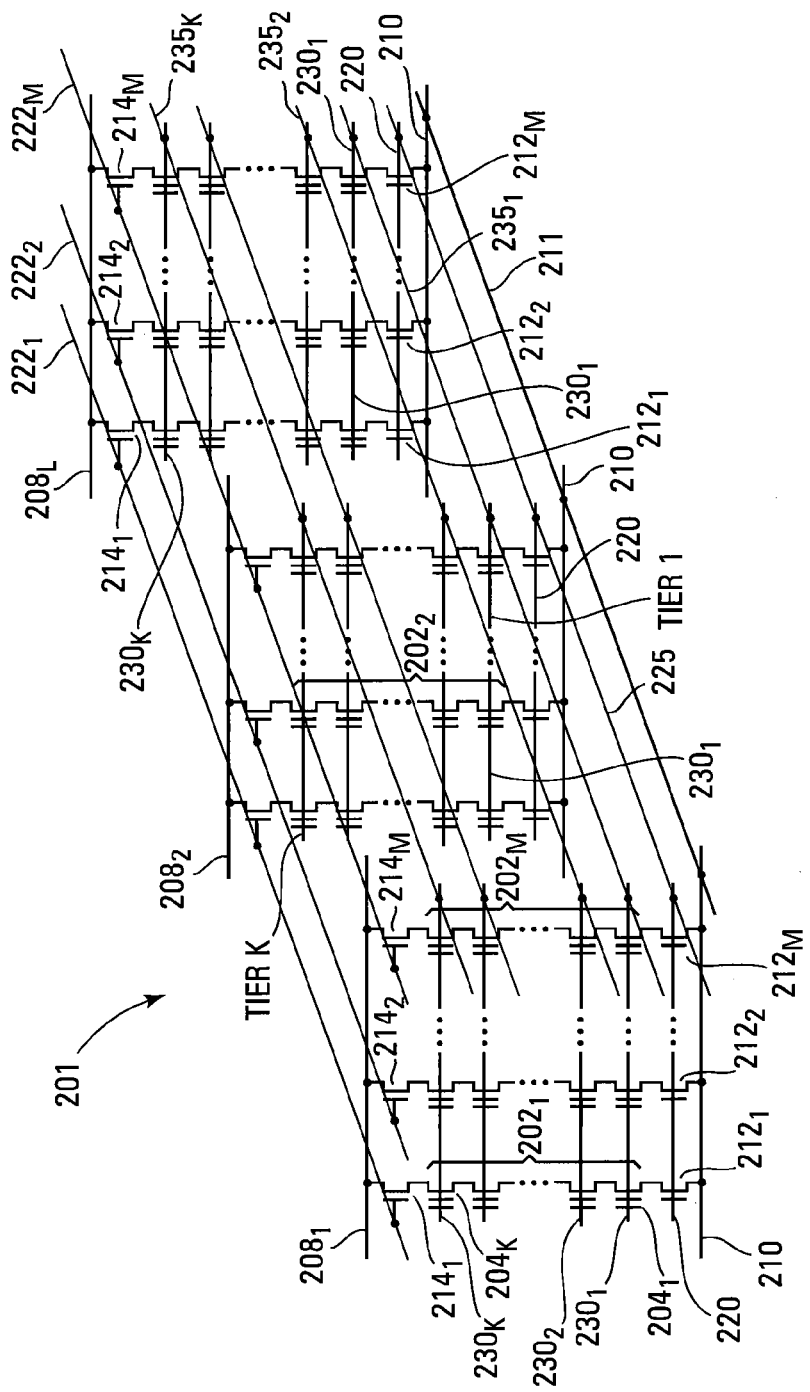
FIG. 2 illustrates a schematic representation of a memory block of a three-dimensional memory array of the background art.

FIG. 2 illustrates a schematic representation of a memory block 201 of a three-dimensional memory array, according to the background art. Block 201 includes substantially vertical strings 202 (e.g., NAND strings) of series-coupled memory cells $204_1$ to $204_K$, e.g., non-volatile memory cells, that may be adjacent to substantially vertical semiconductor pillars. A semiconductor pillar may act as channel region for the string of memory cells adjacent thereto. That is, during operation of one or more memory cells 204 of a string 202, a channel can be formed in the corresponding semiconductor pillar.

The strings 202 may be each coupled between a data line, such as a bit line 208 (e.g., between one of bit lines $208_1$ to $208_L$), and a source 210. A plurality of strings 202 (e.g., strings $202_1$ to $202_M$) may be coupled to the same bit line 208 and the same source 210. The sources 210 may be commonly coupled to a common source 211.

For some embodiments, each memory cell location in a string may correspond to a tier within memory block 201. For example, memory cells $204_1$ to $204_K$ may be respectively located in tiers 1 to K, e.g., where tiers 1 to K are respectively located at different vertical locations within block 201.

One end of each string 202 may be selectively coupled to a source 210 through a select transistor, such as a source select transistor 212. For example, strings $202_1$ to $202_M$ may be selectively coupled to a source 210 through source select transistors $212_1$ to $212_M$. An opposite end of each string 202 may be selectively coupled to a bit line 208 through a select transistor, such as a drain select transistor 214. For example, strings $202_1$ to $202_M$ may be selectively coupled to a bit line 208 through drain select transistors $214_1$ to $214_M$.

The control gates of the source select transistors $212_1$ to $212_M$ selectively coupled to a single source 210 may be commonly coupled to a select line, such as a source select line 220. Source select lines 220 may be commonly coupled to a common source select line 225, e.g., a common source-select plate, that couples the control gates of all of the select transistors 212 in block 201 together.

Drain select lines $222_1$ to $222_M$ may be respectively commonly coupled to the control gates of drain select transistors $214_1$ to $214_M$. For example, drain select line $222_1$ may be commonly coupled to the control gates of the drain select transistors $214_1$ coupled to strings $202_1$, and drain select line $222_M$ may be commonly coupled to the control gates of the drain select transistors $214_M$ coupled to strings $202_M$. Note, however, that the control gates of the select transistors $214_1$ to $214_M$ that are coupled to a single bit line 208 are not coupled to each other.

The control gates of the memory cells $204_1$ to $204_K$ of each of the strings $202_1$ to $202_M$ selectively coupled to a single bit line 208 and a single source 210 may be commonly coupled to an access line, such as one of word lines $230_1$ to $230_K$. For example, the control gates of the memory cells $204_1$ of each of strings $202_1$ to $202_M$ may be commonly coupled to a word line $230_1$, and the control gates of the memory cells $204_K$ of each of strings $202_1$ to $202_M$ may be commonly coupled to a word line $230_K$. Word lines $230_1$ to $230_K$ may be respectively commonly coupled to common word lines $235_1$ to $235_K$, e.g., that may be referred to as common control-gate plates. For example, the control gates of all of the memory cells in a tier, such as any one of tiers 1 to K, may be merged (e.g., commonly coupled) to one control-gate plate.

Figure 3:
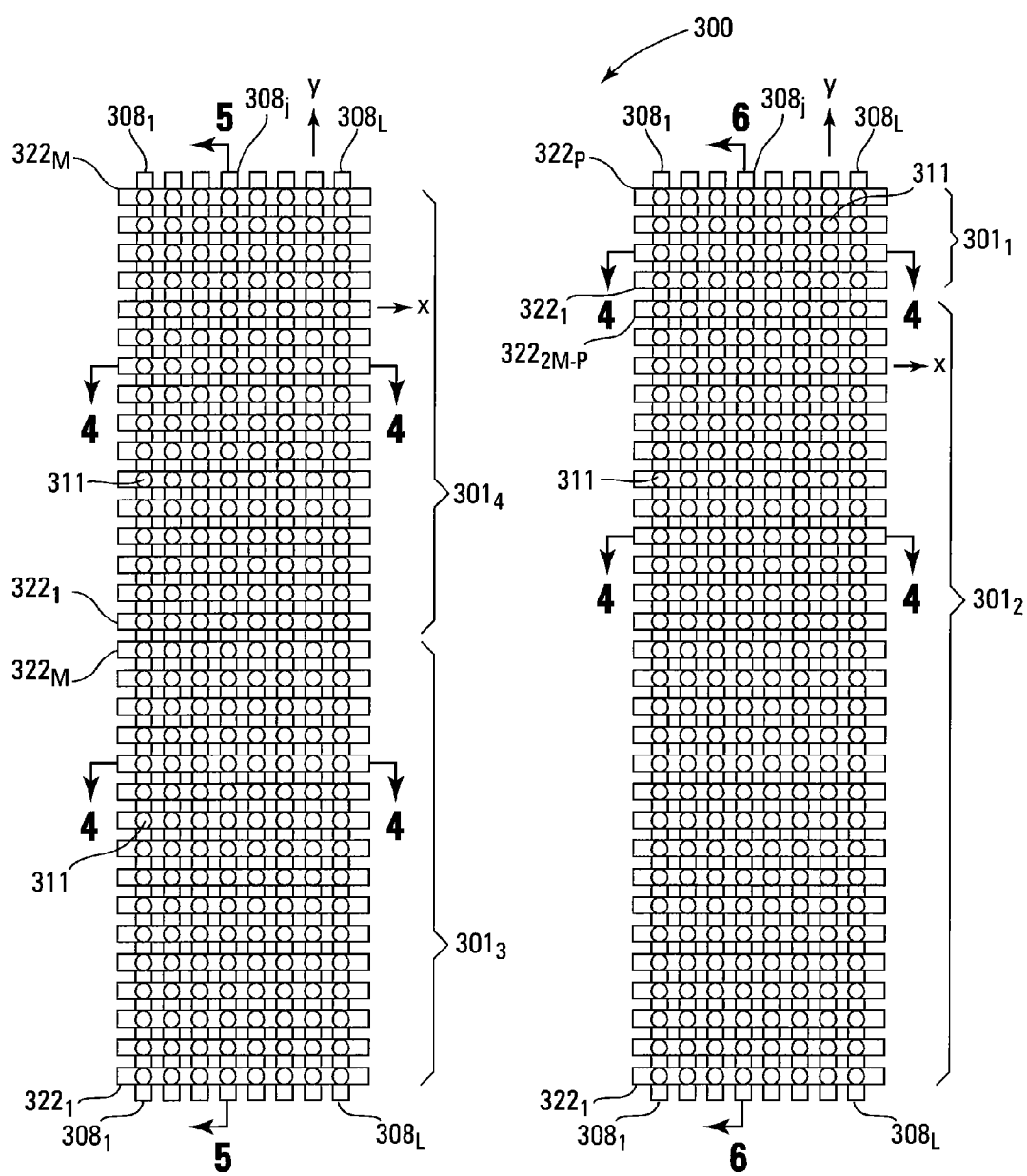
FIG. 3 is a top view of a memory array that includes a plurality of memory blocks, according to an embodiment.

FIG. 3 is a top view (e.g., in an x-y plane) of a memory array 300, e.g., that may be a portion of memory array 104 in FIG. 1, that includes a plurality of memory blocks 301, e.g., including memory blocks $301_1$ to $301_4$, that are independently accessible. For example, the plurality of memory blocks 301 may be independently programmable, readable, and/or erasable.

Figure 4:
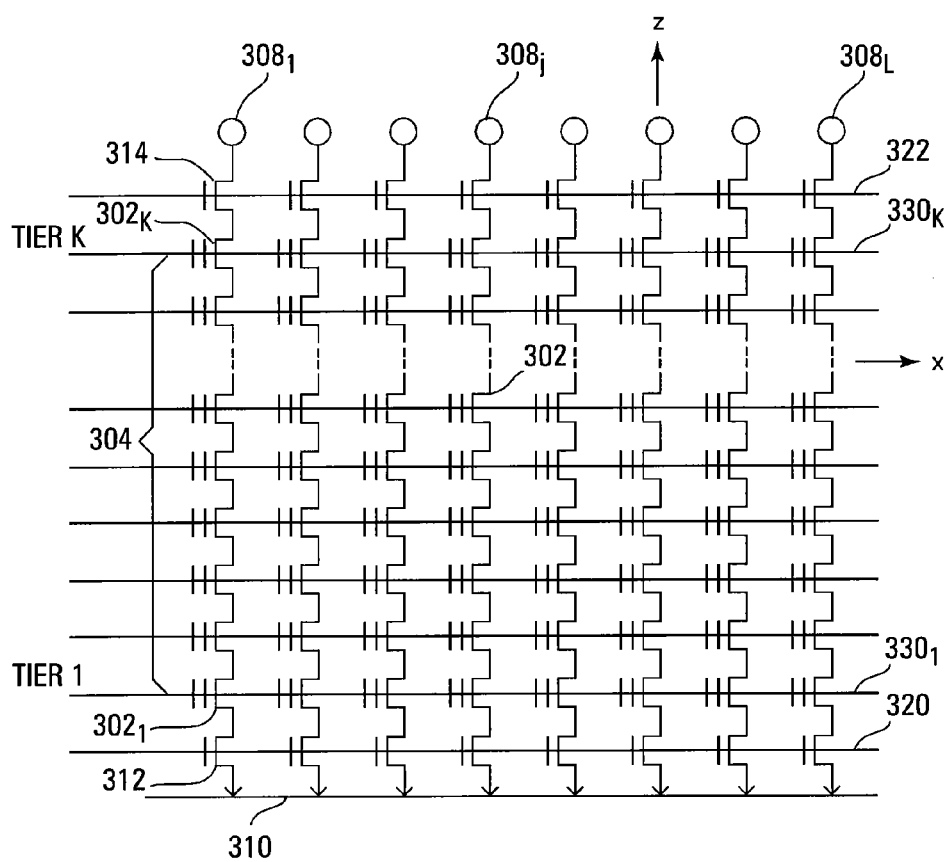
FIG. 4 is a schematic of a cross-section taken along lines 4-4 in FIGS. 3, 7, and 8.

For some embodiments, each block 301 may be a three-dimensional memory block, e.g., similar to memory block 201 described above in conjunction with FIG. 2. FIG. 4 is a schematic of a cross-section taken along lines 4-4 in FIGS. 3, 7, and 8, and may be in an x-z plane. FIG. 5 is a schematic of a cross-section taken along line 5-5 in FIG. 3 and may be in a y-z plane, and FIG. 6 is a schematic of a cross-section taken along lines 6-6 in FIG. 3 and may be in the y-z plane.

Each memory block 301 may include a plurality of strings (e.g., NAND strings) 304 of series-coupled memory cells (e.g., non-volatile flash memory cells) 302 between a data line, such as one of bit lines $308_1$ to $308_L$, and a source 310, as shown in FIGS. 4-6. For example, bit lines $308_1$ to $308_L$ may extend in the y-direction, e.g., substantially parallel to the face planes of FIGS. 3, 5, and 6 and substantially perpendicular to the face plane of FIG. 4. For some embodiments, each string 304 may be substantially vertical and may be adjacent to a substantially vertical semiconductor pillar. For example, the vertical direction may be in the z-direction in FIGS. 4-6, which is substantially perpendicular to the face plane of FIG. 3. Note that each location 311 in FIG. 3 corresponds to a string 304 of memory cells 302, and thus a substantially vertical semiconductor pillar.

The memory cells 302 in each string 304 in each block 301 are respectively located at different vertical levels (e.g., that may be referred to as tiers). For example, memory cells $302_1$ to $302_K$ in the string 304 in FIG. 4 are respectively located in tiers 1 to K. Note that the strings 304 in each block 301 may have the same number of memory cells 302, such as K memory cells 302. For example, each block 301 may have the same number of tiers and thus the same number of memory cells 302 in the z-direction. For some embodiments, each block 301 may have the same number of bit lines, such as L bit lines, and thus the same number of strings 304 (and thus the same number of pillars) in the x-direction, e.g., in the x-z plane (FIG. 4). For example, each block 301 may have the same number of memory cells 302 in the x-direction, as shown in FIG. 3 in combination with FIG. 4.

The memory cells 302 in each tier may be commonly coupled to an access line, such as one of the word lines $330_1$ to $330_K$, that extends in the x-direction, as shown in FIG. 4, and that extends in the y-direction, as shown in FIGS. 5 and 6. For example, word lines $330_1$ to $330_K$ may be respectively in tiers 1 to K. For some embodiments, a word line 330 may couple or may be formed by the control gates of the memory cells 302 at a given tier. Note that the word lines 330 in each tier run (extend) in both the x- and y-directions, as shown in FIGS. 4-6, so that the control gates of the memory cells 304 in both the x- and y-directions in each tier are commonly coupled, e.g., to a control-gate plate. The commonly coupled control gates in each tier (e.g., the control-gate plate for each tier) may be coupled to a single driver transistor for receiving a voltage therefrom.

Each string 304 may be coupled to a source 310 by a select transistor 312, such as a source select transistor, and to a bit line 308 by a select transistor 314, such as a drain select transistor, as shown in FIGS. 4-6. The control gates of the select transistors 312 in each block 301 may be commonly coupled to a select line 320. Note that the select lines 320 run (extend) in both the x- and y-directions, as shown in FIGS. 4-6, so that the control gates of select transistors 312 in both the x- and y-directions are commonly coupled.

The control gates of the select transistors 314 in each block 301 may be commonly coupled to a select line 322 in the x-direction only but not in the y-direction, as shown in FIGS. 3-6. For example, select lines 322 might only run (extend) in the x-direction. Note that select lines 322 running in the x-direction may be directly vertically above the word lines 330 running in the x-direction, as shown in FIG. 4. This means that each select line 322 in FIG. 3 running in the x-direction has corresponding word lines 330 running in the x-direction. Each memory block 301 may include a respective plurality of strings 304 of memory cells 302, where each of the plurality of strings 304 of memory cells 302 of a block 301 are coupled to a respective select transistor (e.g., a respective source select transistor 212), and wherein each of those select transistors are coupled to a common select line (e.g., a common source select line 220).

Note that blocks 301 may be formed by cutting through (e.g., severing) the word lines 330 and the select lines 320, e.g., by etching, between the blocks. However, the bit lines 308 and the source 310 may be continuous (e.g., uncut) between the blocks. For example, the bit lines 308 and a source 310 may serve more than one block. For some embodiments, blocks $301_1$ to $301_4$ might be successively adjacent blocks, e.g., in the y-direction.

The plurality of blocks 301 in FIG. 3 comprises at least three different block sizes, e.g., where a block size may be defined by the number of memory cells in a block. For example, the number of memory cells 302 (e.g., the length of the word lines) in the y-direction in blocks 301 in FIGS. 5 and 6 may determine the size of the respective blocks, in that the number of memory cells 302 in the z-direction (FIGS. 4-6), e.g., in each string, and the number of memory cells in the x-direction may be the same for each block 301.

In the example of FIGS. 3-6, blocks $301_3$ and $301_4$ may be the same size and are smaller than block $301_2$ and larger than block $301_1$. Note that the different sized blocks 301 in FIG. 3 may have different numbers of select lines 322. The number of word lines 330 coupled to a given string 304 of memory cells may be the same for each of the blocks 301. For some embodiments, blocks $301_1$ and $301_2$ may collectively have the same number select lines 322 as blocks $301_3$ and $301_4$ collectively have. For example, blocks $301_3$ and $301_4$ may collectively have M+M=2M select lines 322 and blocks $301_1$ and $301_2$ may collectively have 2M−P+P=2M select lines 322.

In general, for some embodiments, the plurality of blocks 301 may include N different block sizes, where N is a positive integer that may be greater than or equal to three. For example, N may be 3 for the example of FIG. 3. N−1 blocks (e.g., blocks $301_3$ and $301_4$ in FIG. 3) of one block size of the set of N block sizes may collectively have a first number of select lines 322 (e.g., $301_3$ and $301_4$ collectively have 2M select lines in FIG. 3). A group of blocks consisting of a respective block of each remaining block size (e.g., blocks $301_1$ and $301_2$ in FIG. 3) of the set of N block sizes may collectively have a second number of select lines (e.g., 2M) that is equal to the first number.

Since block $301_1$ is smaller than blocks $301_2$ to $301_4$, block $301_1$ can be programmed and read more quickly than blocks $301_2$ to $301_4$. For example, block $301_1$ might be referred to as a "fast" block and blocks $301_2$ to $301_4$ as "slow" blocks. For some embodiments, blocks $301_2$ to $301_4$ may be used to store types data that may be updated or changed more frequently than the types of data that block $301_1$ may be used to store. For example, block $301_1$ might be used as a "boot" block and/or might store BIOS (Basic Input Output System) routines and/ or an operating system. For some embodiments, block $301_1$ might be designated as a read-only block. For other embodiments, block $301_2$ (e.g., the largest block) might include (e.g., might be designated as) a "dummy" block that is not used for storage of data. For some embodiments, only a small portion of the plurality of blocks of memory array 300, e.g., about one percent to about two percent, might be blocks $300_1$ and $300_2$. Block $301_1$ might be used for "garbage" collection, e.g., for collecting data that is intended for deletion, for other embodiments.

Note that each tier of memory cells may be commonly coupled to a control-gate plate and that the number of memory cells and the length of the word lines in the x-direction may be the same for each tier of each block 301. However, blocks $301_3$ and $301_4$ have more memory cells, and thus longer word lines, in the y-direction than block $301_1$. This means that the control-gate plates of blocks $301_3$ and $301_4$ have a larger capacitance than the control-gate plate of block $301_1$ because blocks $301_3$ and $301_4$ have a larger number of memory cells and longer word lines in the y-direction than block $301_1$. Block $301_2$ has more memory cells, and thus longer word lines, in the y-direction than blocks $301_3$ and $301_4$, meaning that the control-gate plate of block $301_2$ has a larger capacitance than the control-gate plates of blocks $301_3$ and $301_4$ because block $301_2$ has a larger number of memory cells and longer word lines in the y-direction than blocks $301_3$ and $301_4$. Higher capacitance control-gate plates act to slow the programming and reading of the memory cells of a given tier compared to lower capacitance control-gate plates. Therefore, memory block $301_2$ is slower to program and read than blocks $301_3$ and $301_4$, and blocks $301_3$ and $301_4$ are slower to program and read than block $301_1$.

Figure 7:
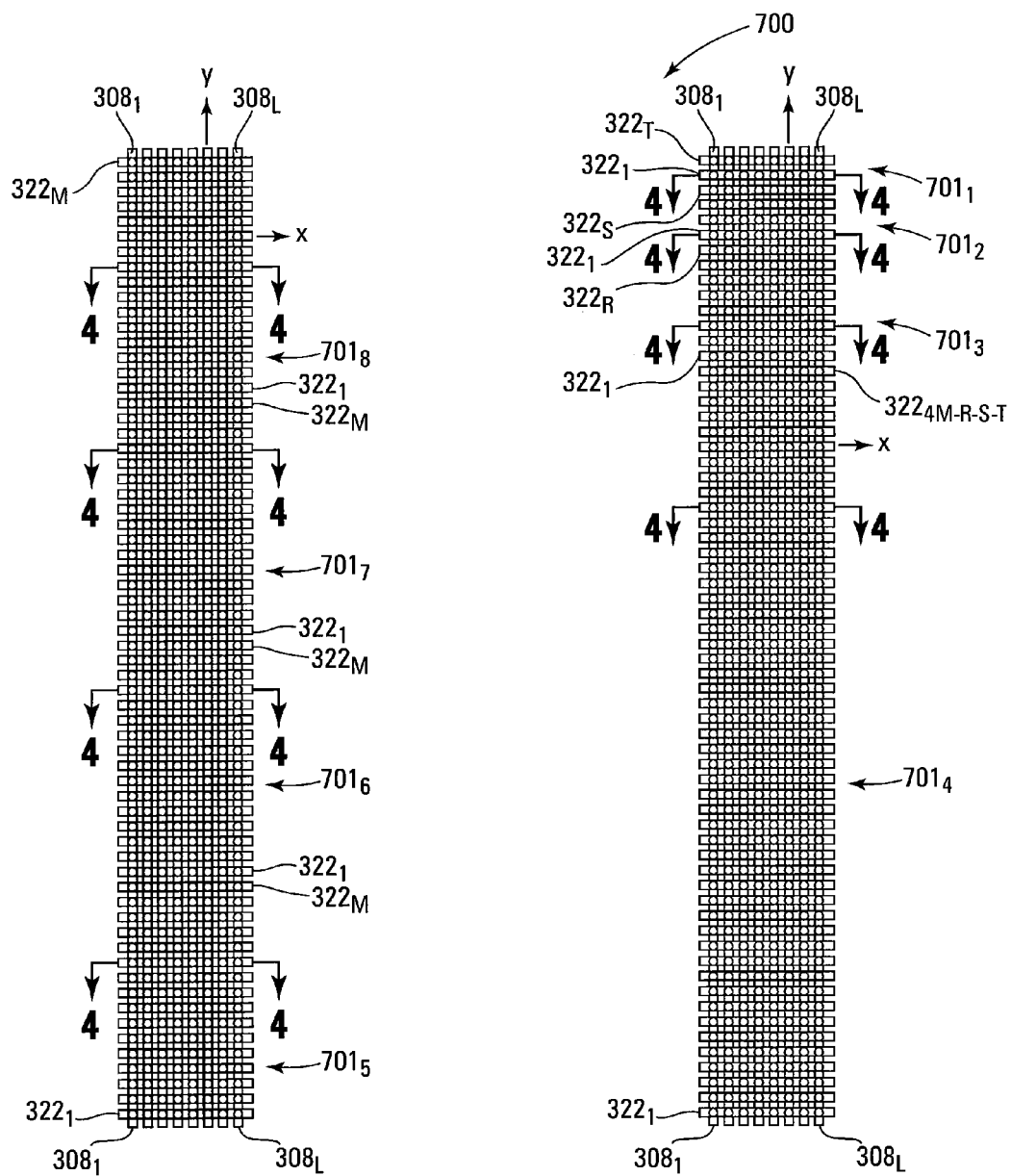
FIG. 7 is a top view of a memory array that includes a plurality of memory blocks, according to another embodiment.

FIG. 7 is a top view (e.g., in an x-y plane) of a memory array 700. Memory array 700 may include a plurality of memory blocks 701, e.g., memory blocks $701_1$ to $701_8$, that are independently programmable, readable, and/or erasable. Note that bit lines 308 may be common to blocks $701_1$ to $701_8$ for some embodiments.

Each of memory blocks $701_5$ to $701_8$ may be the same size as each other and may be substantially the same (e.g., the same) as memory blocks $301_3$ and $301_4$, as described above in conjunction with FIGS. 3-5. For some embodiments, memory blocks $701_1$ to $701_4$ may respectively have different sizes, where the size of each of memory blocks $701_1$ to $701_4$ is different than the size of memory blocks $701_5$ to $701_8$. For example, each of blocks $701_1$ to $701_3$ might be smaller than blocks $701_5$ to $701_8$, and block $701_4$ might be larger than blocks $701_5$ to $701_8$. For some embodiments, block $701_4$ might be a dummy block.

Therefore, the plurality of blocks 701 in FIG. 7 may include at least 5 different block sizes, e.g., N=5. Note that N−1 (four) blocks (e.g., blocks $701_5$ to $701_8$ in FIG. 7) of one block size of the set of N block sizes may collectively have 4M select lines. A group of blocks consisting of a respective block of each remaining block size of the set of N block sizes (e.g., blocks $701_1$ to $701_4$ in FIG. 7) may also collectively have (4M−R−S−T)+R+S+T=4M select lines. For example, block $701_1$ has select lines $322_1$ to $322_T$, meaning block has T select lines; block $701_2$ has select lines $322_1$ to $322_S$, meaning block has S select lines; block $701_3$ has select lines $322_1$ to $322_R$, meaning block has R select lines; and block $701_4$ has select lines $322_1$ to $322_{4M-R-S-T}$, meaning block has 4M−R−S−T select lines.

Each of memory blocks $701_1$ to $701_3$ might be a "fast" block, in that each of memory blocks $701_1$ to $701_3$ can programmed and read faster than blocks $701_4$ to $701_8$. For some embodiments, blocks $701_4$ to $701_8$ may be used to store types data that may be updated or changed more frequently than the types of data that blocks $701_1$ to $701_3$ may be used to store. For example, blocks $701_1$ to $701_3$ might be used as "boot" blocks and/or might store BIOS routines and/or operating systems. For some embodiments, blocks $701_1$ to $701_3$ might be designated as a read-only blocks. Blocks $701_1$ to $701_3$ might be used for "garbage" collection for other embodiments.

Note that the control-gate plate coupled to each tier of each of memory blocks $701_1$ to $701_3$ may have a lower capacitance than the control-gate plate coupled to each tier of each of blocks $701_5$ to $701_8$, in that each of memory blocks $701_1$ to $701_3$ has fewer memory cells, and thus shorter word lines, in the y-direction than each of blocks $701_4$ to $701_8$. The control-gate plate coupled to each tier of blocks $701_5$ to $701_8$ may have a lower capacitance than the control-gate plate coupled to each tier of block $701_4$, in that each of memory blocks $701_5$ to $701_8$ have fewer memory cells, and thus shorter word lines, in the y-direction than block $701_4$.

Figure 8:
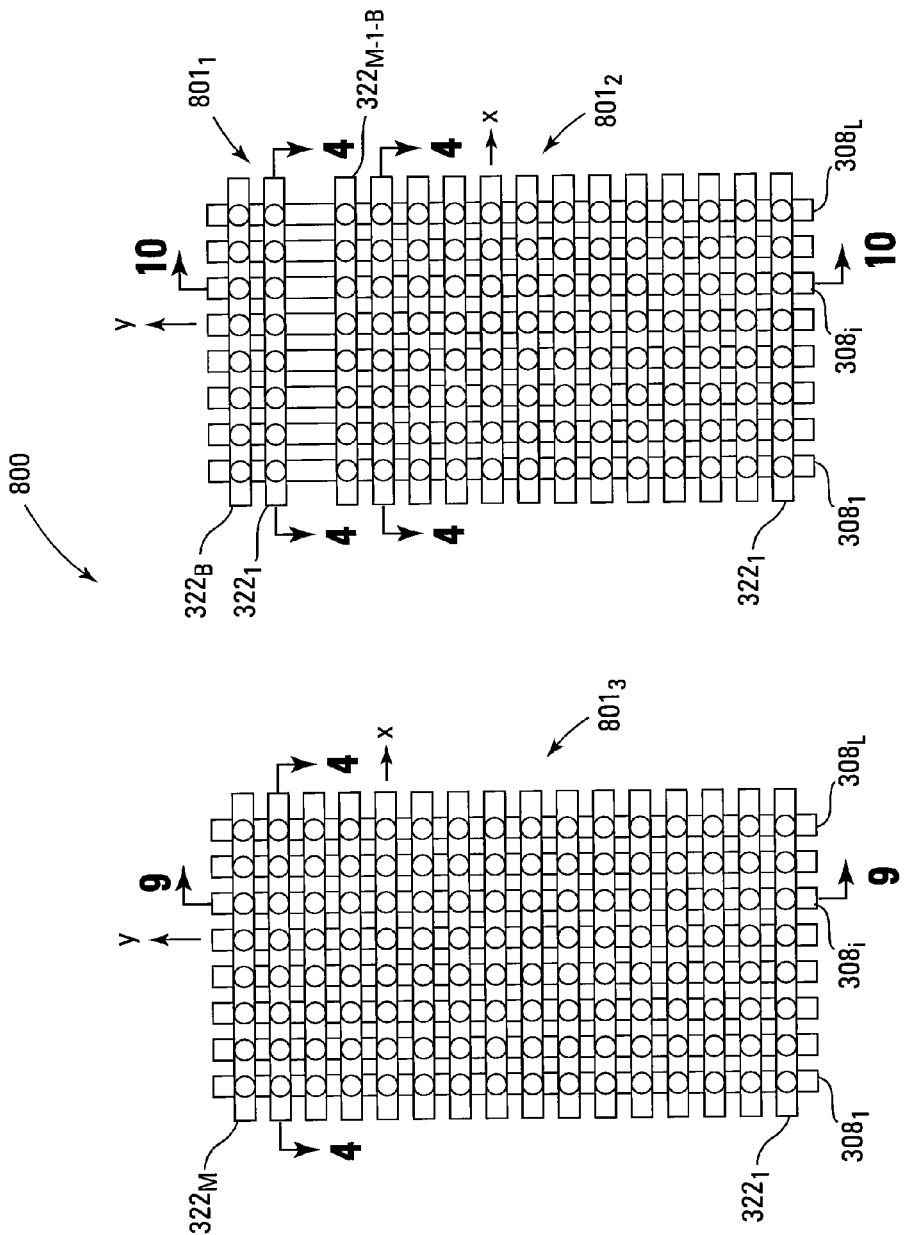
FIG. 8 is a top view of a memory array that includes a plurality of memory blocks, according to another embodiment.
Figure 9:
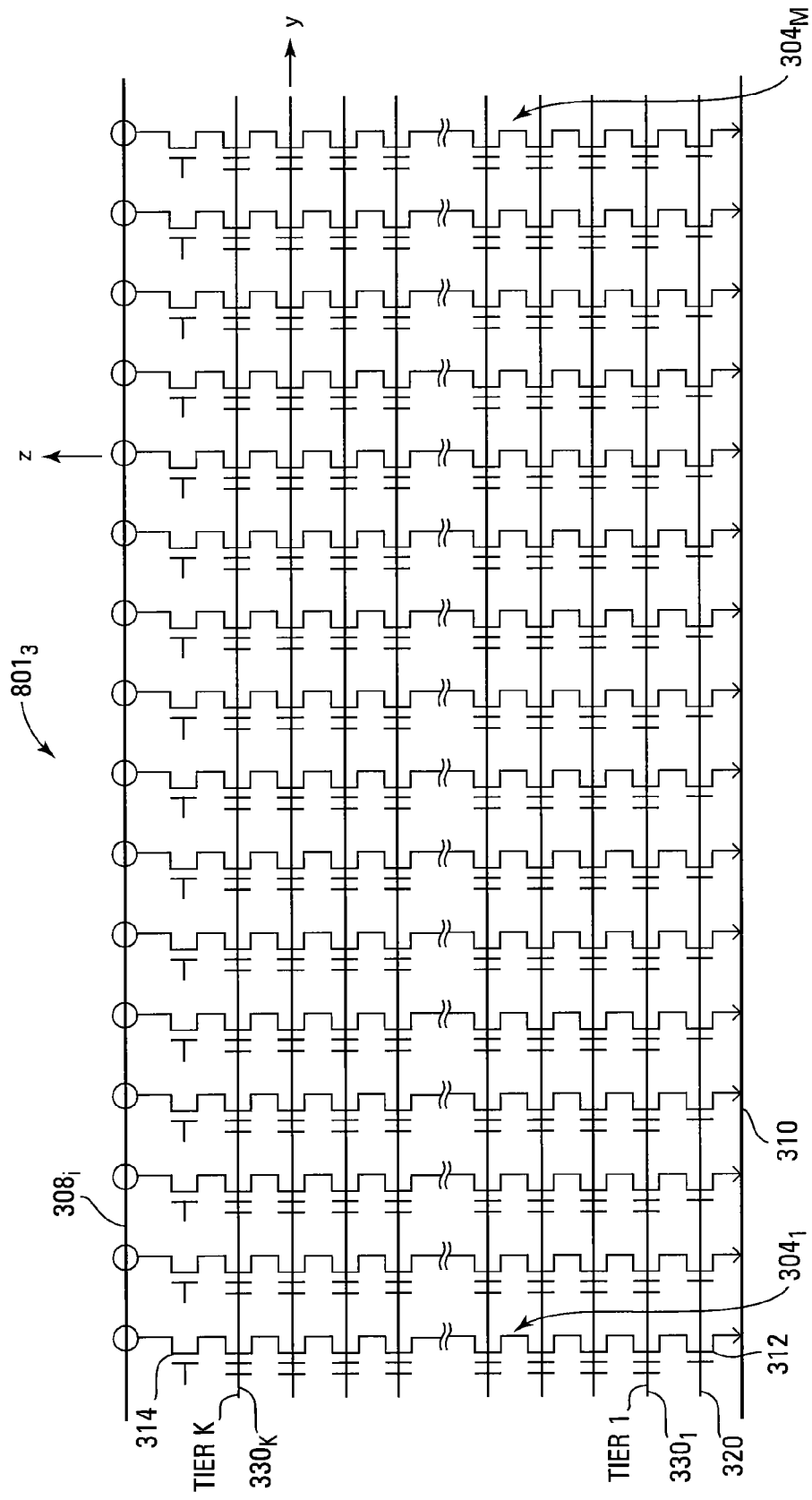
FIG. 9 is a schematic of a cross-section viewed along line 9-9 in FIG. 8.
Figure 10:
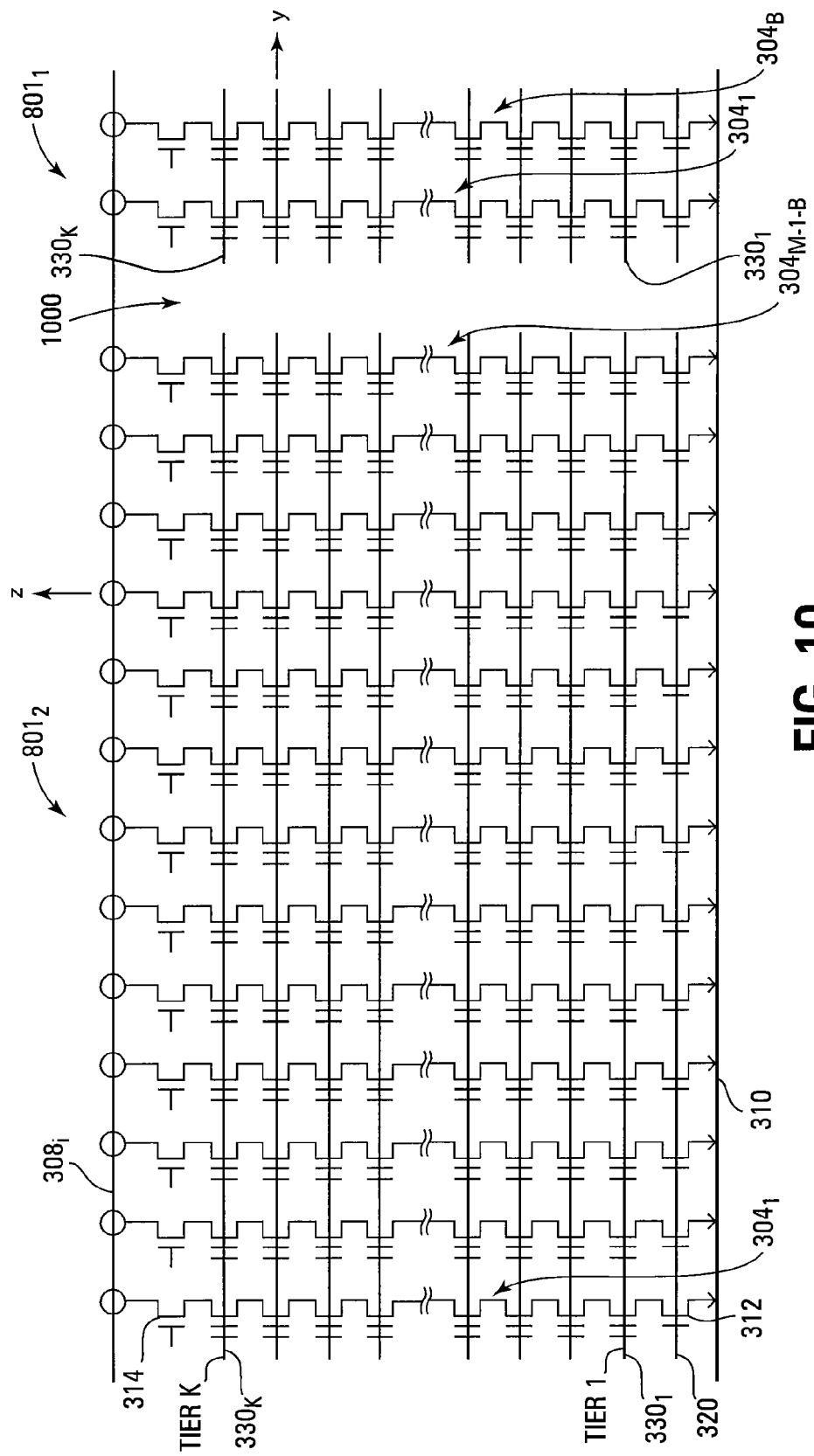
FIG. 10 is a schematic of a cross-section viewed along line 10-10 in FIG. 8.

FIG. 8 is a top view (e.g., in an x-y plane) of a memory array 800, e.g., that may be a portion of memory array 104 in FIG. 1, that includes a plurality of memory blocks 801, such as memory blocks $801_1$ to $801_3$ that are independently programmable, readable, and/or erasable. FIG. 9 is a schematic of a cross-section (e.g., in a y-z plane) viewed along line 9-9 in FIG. 8, and FIG. 10 is a schematic of a cross-section (e.g., in a y-z plane) viewed along line 10-10 in FIG. 8. Common numbering is used in FIGS. 3, 5, and 6 and FIGS. 9 and 10 to denote similar (e.g., the same) components).

Block $801_3$ may be substantially the same (e.g., the same) as memory blocks $301_1$ and $301_2$, as described above in conjunction with FIGS. 3-5. Although block $801_1$ is shown to have B select lines 322, where B=2, block $801_1$ can have any number of select lines that is less than the number of select lines 322 of blocks $801_2$ and $801_3$, such as 1, 4, 8, etc. select lines 322.

Blocks $801_1$ to $801_3$ may be respectively of different sizes, e.g., while the total layout area of blocks $801_1$ and $801_2$ may be the same as that of block $801_3$. For example, block $801_1$ may be smaller than block $801_2$, and block $801_2$ may be smaller than block $801_3$. For some embodiments, block $801_1$ might be a "fast" block, in that it can be programmed and read faster than blocks $801_2$ and $801_3$.

For some embodiments, block $801_2$ may be a "dummy" block. For other embodiments, blocks $801_2$ and $801_3$ may be used to store types data that may be updated or changed more frequently than the types of data that block $801_1$ may be used to store. For example, block $801_1$ might be used as "boot" block and/or might store BIOS routines and/or operating systems. For some embodiments, block $801_1$ might be designated as a read-only block. Block $801_1$ might be used to collect "garbage" for other embodiments.

For some embodiments, the formation of blocks $801_1$ and $801_2$ might involve removing (e.g., not forming) a select line 322, a portion of a dimension of a select plate, e.g., commonly coupled to select lines 320, running in the x-direction, and a portion of a dimension of a control-gate plate, e.g., commonly coupled to word lines 330, running in the x-direction from between blocks $801_1$ and $801_2$. For example, for the region between blocks $801_1$ and $801_2$, the select line 322 between bit lines 308 and source 310, the portion of the select plate between bit lines 308 and source 310, and the portion of control-gate plate, e.g., commonly coupled to word lines $330_1$ to $330_K$, between bit lines 308 and source 310 in FIG. 4 would be removed. For example, a string 304 of memory cells and the select transistors 312 and 314 coupled thereto may be removed between blocks $801_2$ and $801_3$, as indicated by the gap 1000 in FIG. 10.

Therefore, blocks $801_1$ and $801_2$ may collectively have fewer select lines 322 (e.g., one fewer select line 322) than block $801_3$ for some embodiments, as shown in FIG. 8. For example, memory array 800 may have three different block sizes, so N=3. This means that a block (e.g., block $801_3$) having one of (e.g., the largest of) the set of three block sizes may have a first number (e.g., M) of select lines 322 and that a group of blocks consisting of a respective block of each remaining block size (e.g., blocks $801_1$ and $801_2$) collectively have a second number of select lines 322 that is less than the first number of select lines 322 of block $801_3$. For example, the second number of select lines 322 (e.g., (M−1−B)+B=M−1) may be one fewer the first number (M) of select lines.

Figure 11:
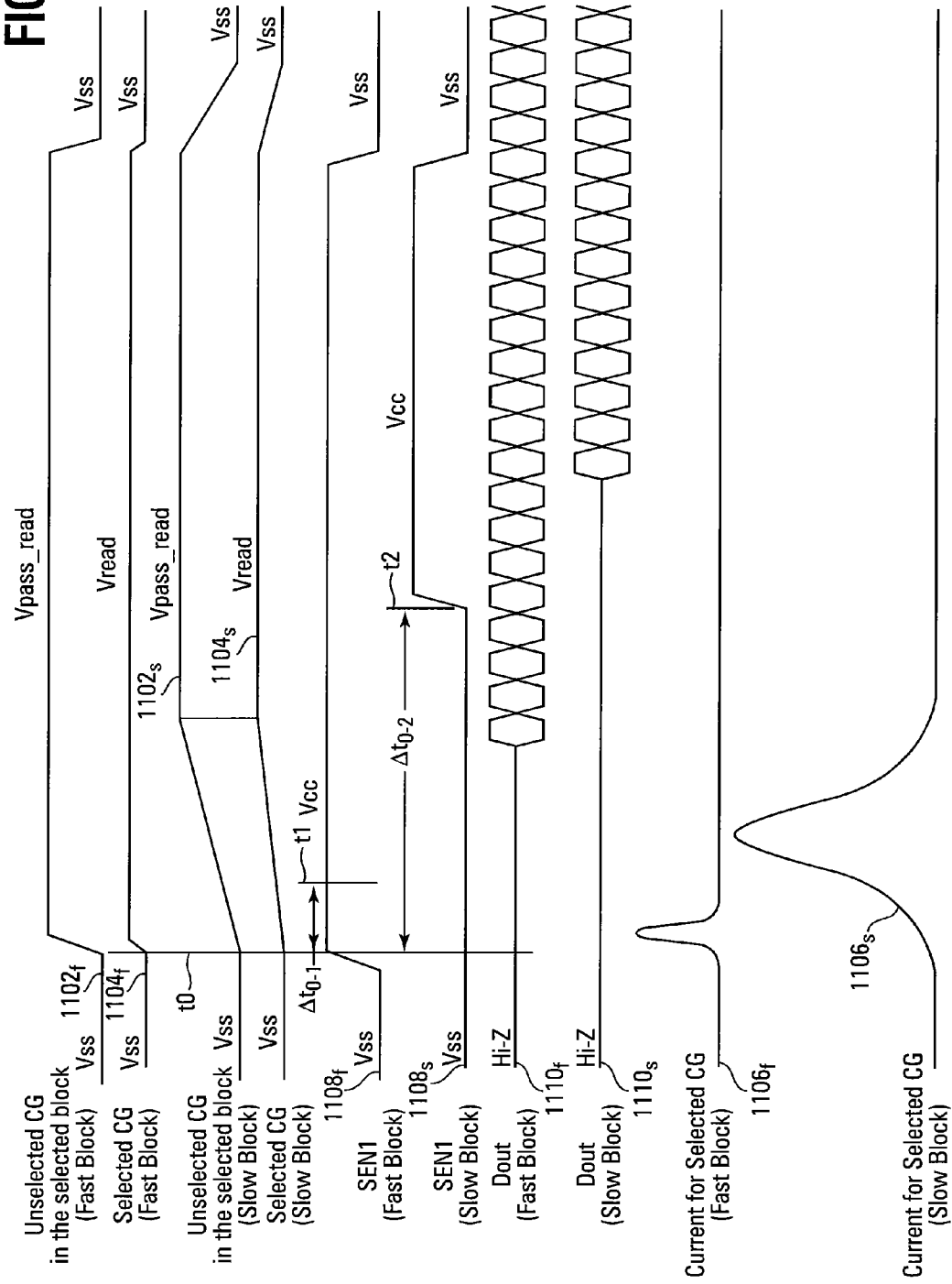
FIG. 11 presents timing diagrams for read operations, according to another embodiment.

FIG. 11 presents timing diagrams for read operations (e.g., that control logic 116 in FIG. 1 might be configured to perform) for "fast" memory blocks, such as block $301_1$ in FIGS. 3, 4, and 6, blocks $701_1$ to $701_3$ in FIG. 7, and block $801_1$ in FIGS. 8 and 10, and read operations (e.g., that control logic 116 might be configured to perform) for "slow" blocks, such as blocks $301_2$ to $301_4$ in FIGS. 3 to 6, blocks $701_4$ to $701_8$ in FIG. 7, and block $801_3$ in FIGS. 8 and 9. It is further noted that the terms "fast" and "slow" are relative to the block sizes, such that the "fast" block and "slow" block designations of FIG. 11 could be extended to a pair of blocks of different block sizes. For example, a block $701_1$ of FIG. 7 could correspond to a "fast" block of FIG. 11, and a block $701_2$ of FIG. 7 could correspond to a "slow" block of FIG. 11, even though a block $701_2$ is faster than other blocks $701_3$-$701_8$ of FIG. 7. As such, FIG. 11 is intended to demonstrate the relative differences in how read operations might be performed on different memory blocks of various embodiments. Thus, while blocks $701_1$ to $701_3$ in FIG. 7 may utilize the same timing for read operations, different timings could also be utilized.

The timing diagram $1102_f$ for the voltage applied to an unselected control-gate plate of a "fast" block and the timing diagram $1102_s$ for the voltage applied to an unselected control-gate plate of a "slow" block show that the voltages applied to the respective unselected control-gate plates of the "fast" and "slow" blocks are increased from an initial voltage, such as Vss, to a read pass voltage Vpass_read, starting at a time t0. Note that the time t0 is an initial time for the respective timing diagrams and does not correspond to the same instant of time for "fast" and "slow" blocks. Comparison of the timing diagram $1102_f$ for the voltage applied to the unselected control-gate plate of the "fast" block to the timing diagram $1102_s$ for the voltage applied to the unselected control-gate plate of the "slow" block shows that the lower capacitance of the unselected control-gate plate of the "fast" block allows the voltage applied to control-gate plate of the "fast" block to reach the read pass voltage Vpass_read from Vss in less time (e.g., faster) than the higher capacitance of the unselected control-gate plate of the "slow" block allows the voltage applied to control-gate plate of the "slow" block to reach the read pass voltage Vpass_read from Vss. For example, the voltage applied to the unselected control-gate plate of the "fast" block increases to the read pass voltage Vpass_read from Vss at a higher rate than the voltage applied to the unselected control-gate plate of the "slow" block.

The timing diagram $1104_f$ for the voltage applied to a selected control-gate plate of the "fast" block and the timing diagram $1104_s$ for the voltage applied to a selected control-gate plate of the "slow" block show that the voltages applied to the respective selected control-gate plates of the "fast" and "slow" blocks are increased from an initial voltage, such as Vss, to a read voltage Vread, starting at the time t0. For some embodiments, the voltage applied to the unselected and selected control-gate plates of the "fast" block might be respectively increased from Vss to the read pass voltage Vpass_read and the read voltage Vread substantially concurrently (e.g., concurrently), and the voltage applied to the unselected and selected control-gate plates of the "slow" block might be respectively increased from Vss to the read pass voltage Vpass_read and the read voltage Vread substantially concurrently (e.g., concurrently).

Comparison of the timing diagram $1104_f$ for the voltage applied to the selected control-gate plate of the "fast" block to the timing diagram $1104_s$ for the voltage applied to the selected control-gate plate of the "slow" block shows that the lower capacitance of the selected control-gate plate of the "fast" block allows the voltage applied to selected control-gate plate of the "fast" block to reach the read voltage Vread from Vss in less time than the higher capacitance of the selected control-gate plate of the "slow" block allows the voltage applied to selected control-gate plate of the "slow" block to reach the read voltage Vread from Vss. For example, the voltage applied to the selected control-gate plate of the "fast" block increases from Vss to the read voltage Vread at a higher rate than the voltage applied to the selected control-gate plate of the "slow" block.

Comparison of the timing diagram $1106_f$ for the current applied to the selected control-gate plate of the "fast" block to the timing diagram $1106_s$ for the current applied to a selected control-gate plate of the "slow" block shows that the lower capacitance of the selected control-gate plate of the "fast" block allows the current applied to control-gate plate of the "fast" block to reach a peak level in a shorter time than the higher capacitance of the selected control-gate plate of the "slow" block allows the current applied to control-gate plate of the "slow" block to reach a peak level.

Moreover, the timing diagram $1106_f$ shows that less current is required to bring the voltage of the selected control-gate plate of the "fast" block from the initial voltage Vss to the read voltage Vread than is required to bring the voltage of the selected control-gate plate of the "slow" block from the initial voltage Vss to the read voltage Vread. For example, the current applied to the selected control-gate plate of the "fast" block has a lower peak value and is applied for a less time than the current applied to the selected control-gate plate of the "slow" block. Therefore, the "fast" block requires less power to read than the "slow" block.

Timing diagrams $1108_f$ and $1108_s$ are for signals, e.g., page buffer activation signals, coupled (e.g., sent) to a page buffer, e.g., coupled (e.g., sent) to a sense amplifier latch in the page buffer. Increasing the voltage of the signals from a first voltage, such as Vss, to a second voltage, such as Vcc, activates the sense amplifier latch, allowing the sense amplifier to latch data values read from the selected blocks, e.g., in response to the read voltage Vread, thereby making the data available for output.

The signal corresponding to the "fast" block may be increased from Vss to Vcc, starting at a time t1 that is a certain length of time $\Delta t_{0-1}$ after time t0. For example, control logic, such as control logic 116 in FIG. 1, might be configured to wait for the length of time $\Delta t_{0-1}$ after the start of the increase of the voltage applied to the selected control-gate plate of the "fast" block from the initial voltage Vss to read voltage Vread before activating the latch, starting at time t1.

The latch may be activated for the "slow" block, starting at a time t2 that is a certain length of time $\Delta t_{0-2}$ after time t0, where the length of time $\Delta t_{0-1}$ is shorter than the length of time $\Delta t_{0-2}$. For example, the signal corresponding to the "slow" block may be increased from Vss to Vcc, starting at a time t2 that is the length of time $\Delta t_{0-2}$ after time t0. For example, the time it takes from when the voltage applied to the selected control-gate plate first starts to increase from Vss at time t0 to Vread until data is latched by an activated latch (e.g. data is available for output) is shorter (e.g., less) for the "fast" block than the "slow" block. This compensates for the fact that it takes longer for the selected control-gate plate of the "slow" block to reach the read voltage Vread from Vss than the "fast" block.

Timing diagrams $1110_f$ and $1110_s$ respectively illustrate the output (e.g., over I/O bus 134 in FIG. 1) of the data read, e.g., in response to the read voltage Vread, from the "fast" and "slow" blocks. Timing diagrams $1110_f$ and $1110_s$ illustrate that the data may be output at a certain time after the latches are activated, e.g., after the signals applied to the latches reach Vcc. For example, the length of time it takes from when the voltage applied to the selected control-gate plate "fast" block first starts to increase from Vss to Vread until the output of the data read from the "fast" block first occurs is shorter (e.g., less) than the length of time it takes from when the voltage applied to the selected control-gate plate of the "slow" block first starts to increase from Vss to Vread until the output of the data read from the "slow" block first occurs.

Figure 12:
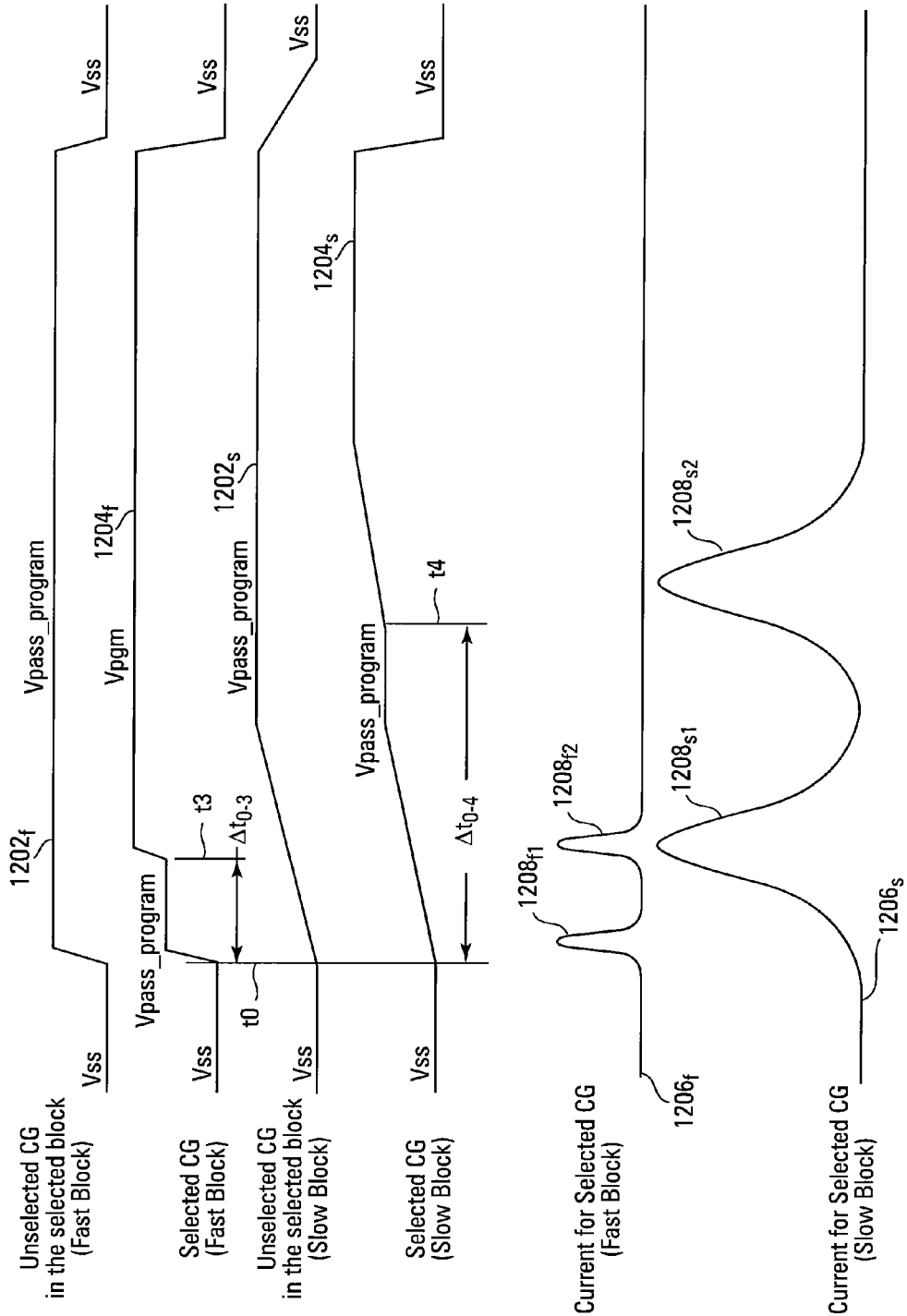
FIG. 12 presents timing diagrams for programing operations, according to another embodiment.

FIG. 12 presents timing diagrams for programing operations (e.g., that control logic 116 might be configured to perform) for "fast" memory blocks, such as block $301_1$ in FIGS. 3 and 6, blocks $701_1$ to $701_3$ in FIG. 7, and block $801_1$ in FIGS. 8 and 10, and programing operations (e.g., that control logic 116 might be configured to perform) for "slow" blocks, such as blocks $301_2$ to $301_4$ in FIGS. 3 to 6, blocks $701_4$ to $701_8$ in FIG. 7, and block $801_3$ in FIGS. 8 and 9. It is further noted that the terms "fast" and "slow" are relative to the block sizes, such that the "fast" block and "slow" block designations of FIG. 12 could be extended to a pair of blocks of different block sizes. For example, a block $701_1$ of FIG. 7 could correspond to a "fast" block of FIG. 12, and a block $701_2$ of FIG. 7 could correspond to a "slow" block of FIG. 12, even though a block $701_2$ is faster than other blocks $701_3$-$701_8$ of FIG. 7. As such, FIG. 12 is intended to demonstrate the relative differences in how programming operations might be performed on different memory blocks of various embodiments. Thus, while blocks $701_1$ to $701_3$ in FIG. 7 may utilize the same timing for programming operations, different timings could also be utilized.

Comparison of the timing diagram $1202_f$ for the voltage applied to an unselected control-gate plate of a "fast" block to the timing diagram $1202_s$ for the voltage applied to an unselected control-gate plate of a "slow" block shows that the lower capacitance of the unselected control-gate plate of the "fast" block allows the voltage applied to the unselected control-gate plate of the "fast" block to reach a program pass voltage Vpass_program from an initial voltage, such as Vss, in less time (e.g., faster) than the higher capacitance of the unselected control-gate plate of the "slow" block allows the voltage applied to unselected control-gate plate of the "slow" block to reach a program pass voltage Vpass_program from Vss. For example, the voltage applied to the unselected control-gate plate of the "fast" block increases to the program pass voltage Vpass_program from Vss at a higher rate than the voltage applied to the unselected control-gate plate of the "slow" block.

Timing diagram $1204_f$ illustrates the timing of a voltage applied to a selected control-gate plate of the "fast" block during programming, and timing diagram $1204_s$ illustrates the timing of a voltage applied to a selected control-gate plate of the "slow" block during programming. For some embodiments, the voltages applied to selected control-gate plates are increased from an initial voltage, such as Vss, to an intermediate voltage, such as the program pass voltage Vpass_program. The voltages applied to the selected control-gate plates may be subsequently increased from the program pass voltage Vpass_program to a program voltage, such as Vpgm.

For some embodiments, the voltage applied to the unselected and selected control-gate plates of the "fast" block might be increased to the program pass voltage Vpass_program from Vss substantially concurrently (e.g., concurrently), and the voltage applied to the unselected and selected control-gate plates of the "slow" block might be increased to the program pass voltage Vpass_program from Vss substantially concurrently (e.g., concurrently). The voltage applied to the selected control-gate plate of the "fast" block might be increased to the program voltage Vpgm from the program pass voltage Vpass_program while the voltage applied to the unselected control-gate plate of the "fast" block is maintained at the program pass voltage Vpass_program, and the voltage applied to the selected control-gate plate of the "slow" block might be increased to the program voltage Vpgm from the program pass voltage Vpass_program while the voltage applied to the unselected control-gate plate of the "slow" block is maintained at the program pass voltage Vpass_program.

Comparison of the timing diagram $1204_f$ for the voltage applied to the selected control-gate plate of the "fast" block to the timing diagram $1204_s$ for the voltage applied to the selected control-gate plate of the "slow" block shows that the lower capacitance of the selected control-gate plate of the "fast" block allows the voltage applied to selected control-gate plate of the "fast" block to reach the program pass voltage Vpass_program from Vss in less time than the higher capacitance of the selected control-gate plate of the "slow" block allows the voltage applied to the selected control-gate plate of the "slow" block to reach the program pass voltage Vpass_program from Vss. For example, the voltage applied to the selected control-gate plate of the "fast" block increases to the program pass voltage Vpass_program from Vss at a higher rate than the voltage applied to the selected control-gate plate of the "slow" block.

Moreover, it takes less time for the selected control-gate plate of the "fast" block to reach the program voltage Vpgm from the program pass voltage Vpass_program than the selected control-gate plate of the "slow" block. For example, the voltage applied to the selected control-gate plate of the "fast" block increases to the program voltage Vpgm from the program pass voltage Vpass_program at a higher rate than the voltage applied to the selected control-gate plate of the "slow" block.

Therefore, the lower capacitance of the selected control-gate plate of the "fast" block allows the voltage applied to the selected control-gate plate of the "fast" block to reach the program voltage Vpgm from Vss in less time than the higher capacitance of the selected control-gate plate of the "slow" block allows the voltage applied to selected control-gate plate of the "slow" block to reach the program voltage Vpgm from Vss. For example, the voltage applied to the selected control-gate plate of the "fast" block increases to the program voltage Vpgm from Vss at a higher rate than the voltage applied to the selected control-gate plate of the "slow" block. Note that for some embodiments, it might take less time for the voltage applied to the selected control-gate plate of the "fast" block to reach the program voltage Vpgm from Vss than it takes for the voltage applied to the selected control-gate plate of the "slow" block to reach the program pass voltage Vpass_program from Vss.

Timing diagram $1204_f$ shows that the voltage applied to the control-gate plate of the "fast" block is increased from Vss to the program pass voltage Vpass_program, starting at time t0. Then, starting at a time t3 that is a length of time $\Delta t_{0-3}$ after time t0, the voltage applied to the control-gate plate of the "fast" block is increased from the program pass voltage Vpass_program to the program voltage Vpgm. For some embodiments, the voltage applied to the control-gate plate of the "fast" block may be maintained at the program pass voltage Vpass_program for a certain portion of the length of time $\Delta t_{0-3}$ before increasing the voltage applied to the control-gate plate of the "fast" block to the program voltage Vpgm. Note that the time t0 is an initial time for the respective timing diagrams and does not correspond to the same instant of time for "fast" and "slow" blocks.

Timing diagram $1204_s$ shows that the voltage applied to the control-gate plate of the "slow" block is increased from Vss to the program pass voltage Vpass_program, starting at time t0. Then, starting at a time t4 that is a length of time $\Delta t_{0-4}$ after time t0, where the length of time $\Delta t_{0-3}$ is shorter than the length of time $\Delta t_{04}$, the voltage applied to the control-gate plate of the "slow" block is increased from the program pass voltage Vpass_program to the program voltage Vpgm. For some embodiments, the voltage applied to the control-gate plate of the "slow" block may be maintained at the program pass voltage Vpass_program for a certain portion of the length of time $\Delta t_{0-4}$ before increasing the voltage applied to the control-gate plate of the "slow" block to the program voltage Vpgm.

A timing diagram $1206_f$ for the current applied to the selected control-gate plate of the "fast" block during programming includes a current pulse $1208_{f1}$ that represents the current that brings the voltage of the selected control-gate plate of the "fast" block from the initial voltage Vss to the program pass voltage Vpass_program and a current pulse $1208_{f2}$ that represents the current that brings the voltage of the selected control-gate plate of the "fast" block from the program pass voltage Vpass_program to the program voltage Vpgm. A timing diagram $1206_s$ for the current applied to the selected control-gate plate of the "slow" block during programming includes a current pulse $1208_{s1}$ that represents the current that brings the voltage of the selected control-gate plate of the "slow" block from the initial voltage Vss to the program pass voltage Vpass_program and a current pulse $1208_{s2}$ that represents the current that brings the voltage of the selected control-gate plate of the "slow" block from the program pass voltage Vpass_program to the program voltage Vpgm.

Note that although current pulse $1208_{f1}$ and current pulse $1208_{f2}$ are shown to be the same as each other and that current pulse $1208_{s1}$ and current pulse $1208_{s2}$ are shown to be the same as each other, this is not necessarily case, and that the intent is to show that it takes less current to bring the voltage applied to the selected control-gate plate of the "fast" block from the initial voltage Vss to the program pass voltage Vpass_program than it takes bring the voltage applied to the selected control-gate plate of the "slow" block from the initial voltage Vss to the program pass voltage Vpass_program and that it takes less current to bring the voltage applied to the selected control-gate plate of the "fast" block from the program pass voltage Vpass_program to the program voltage Vpgm than it takes to bring the voltage applied selected control-gate plate of the "slow" block from the program pass voltage Vpass_program to the program voltage Vpgm.

Indeed, comparison of the timing diagram $1206_f$ for the current applied to the selected control-gate plate of the "fast" block to the timing diagram $1206_s$ for the current applied to a selected control-gate plate of the "slow" block shows that the lower capacitance of the selected control-gate plate of the "fast" block allows the current applied to the selected control-gate plate of the "fast" block to reach peak levels in less time than the higher capacitance of the selected control-gate plate of the "slow" block. Moreover, the timing diagram $1206_f$ shows that less current is required to bring the voltage of the selected control-gate plate of the "fast" block from the initial voltage Vss to the program pass voltage Vpass_program than is required to bring the voltage of the selected control-gate plate of the "slow" block from the initial voltage Vss to the program pass voltage Vpass_program. For example, the current pulse $1208_{f1}$ has a lower peak value and is applied for less time than the current pulse $1208_{s1}$. Therefore, the "fast" block requires less power to bring the selected control-gate plate from the initial voltage Vss to the program pass voltage Vpass_program than the "slow" block.

The timing diagram $1206_f$ shows that less current is required to bring the voltage of the selected control-gate plate of the "fast" block from the program pass voltage Vpass_program to the program voltage Vpgm than is required to bring the voltage of the selected control-gate plate of the "slow" block from the program pass voltage Vpass_program to the program voltage Vpgm. For example, the current pulse $1208_{f2}$ has a lower peak value and is applied for less time than the current pulse $1208_{s2}$. Therefore, the "fast" block requires less power to bring the selected control-gate plate from the program pass voltage Vpass_program to the program voltage Vpgm than the "slow" block, and thus the "fast" block requires less power to bring the selected control-gate plate from the initial voltage Vss to the program voltage Vpgm than the "slow" block, meaning it takes less power to program the "fast" block than the "slow" block.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device, comprising:
   memory cells organized in a plurality of blocks;
   wherein each block of the plurality of blocks comprises a respective plurality of strings of memory cells, where each of the plurality of strings of memory cells of a block is coupled to a respective select transistor, and wherein each of the select transistors coupled to the plurality of strings of the block is coupled to a common first select line; and
   wherein the plurality of blocks comprises:
      a set of N block sizes, wherein the set of N block sizes comprises N different numbers of second select lines;
      wherein N is an integer value greater than or equal to three;
      wherein N−1 blocks of one block size of the set of N block sizes collectively comprise a first number of the second select lines, wherein each of the N−1 blocks of one block size of the set of N block sizes comprises a same number of the second select lines; and
      wherein a group of blocks of the plurality of blocks consists of a respective block of each remaining block size of the set of N block sizes, wherein the blocks of the group of blocks collectively comprise a second number of the second select lines that is equal to the first number of the second select lines, wherein each block of the group of blocks comprises a different number of the second select lines.

2. The memory device of claim 1, wherein the common first select line comprises a common source select line and wherein the second select lines comprise drain select lines.

3. The memory device of claim 1, wherein each block of the plurality of blocks comprises a same number of common control-gate plates.

4. The memory device of claim 1, wherein each block of the plurality of blocks comprises a same number of data lines.

5. The memory device of claim 4, wherein the second select lines of each block of the plurality of blocks run substantially perpendicular to the data lines.

6. The memory device of claim 1, wherein a block of a largest block size of the set of N block sizes comprises a dummy block.

7. The memory device of claim 1, wherein each block size of the set of N block sizes is different than other block sizes of the set of N block sizes.

8. The memory device of claim 1, wherein a block of a smallest block size of the N block sizes is used for garbage collection.

9. The memory device of claim 1, wherein a block of a smallest block size of the set of N block sizes comprises a boot block.

10. The memory device of claim 1, wherein a block of a smallest block size of the N block sizes comprises a read only block.

11. A memory device, comprising:
    memory cells organized in a plurality of blocks;
    wherein each block of the plurality of blocks comprises a respective plurality of strings of memory cells, where each of the plurality of strings of memory cells of a block is coupled to a respective select transistor, and wherein each of the select transistors coupled to the plurality of strings of the block are coupled to a common first select line; and
    wherein the plurality of blocks comprises:
       a set of N block sizes;
       wherein N is an integer value greater than or equal to three;
       wherein a block of one block size of the set of N block sizes comprises a first number of second select lines; and
       wherein a group of blocks of the plurality of blocks consists of a respective block of each remaining block size of the set of N block sizes, wherein the blocks of the group of blocks collectively comprise a second number of second select lines that is less than the first number of second select lines.

12. The memory device of claim 11, wherein each block of the plurality of blocks comprises a same number of common control-gate plates.

13. The memory device of claim 11, wherein each block of the plurality of blocks comprises a same number of data lines.

14. The memory device of claim 11, wherein a block of a smallest block size of the N block sizes is used for garbage collection.

15. The memory device of claim 11, wherein a block of a remaining block size of the set of N block sizes comprises a dummy block.

16. The memory device of claim 11, wherein a block of a smallest block size of the N block sizes comprises a read only block.

17. The memory device of claim 11, wherein a block of a smallest block size of the N block sizes comprises a boot block.

18. The memory device of claim 11, wherein the second number of access second select lines is one less than the first number of second select lines.

19. The memory device of claim 11, wherein the common first select line comprises a common source select line and wherein the second select lines comprise drain select lines.

20. A method of programming memory cells, comprising:
increasing a voltage applied to a selected control-gate plate of a first block of memory cells from a first voltage to a second voltage, starting at a first initial time, and increasing the voltage applied to the selected control-gate plate of the first block of memory cells from the second voltage to a program voltage, starting at a second time that is a first length of time after the first initial time; and
increasing a voltage applied to a selected control-gate plate of a second block of memory cells from the first voltage to the second voltage, starting at a second initial time, and increasing the voltage applied to the selected control-gate plate of the second block of memory cells from the second voltage to the program voltage, starting at a third time that is a second length of time after the second initial time;
wherein the first length of time is shorter than the second length of time.

21. The method of claim 20, further comprising maintaining the voltage applied to the selected control-gate plate of the first block of memory cells at the second voltage for a portion of the first length of time.

22. The method of claim 20, further comprising maintaining the voltage applied to the selected control-gate plate of the second block of memory cells at the second voltage for a portion of the second length of time.

23. The method of claim 20, wherein the voltage applied to the selected control-gate plate of the first block of memory cells is increased from the first voltage to the second voltage at a higher rate than the voltage applied to the selected control-gate plate of the second block of memory cells is increased from the first voltage to the second voltage.

24. The method of claim 20, wherein the voltage applied to the selected control-gate plate of the first block of memory cells is increased from the second voltage to the program voltage at a higher rate than the voltage applied to the selected control-gate plate of the second block of memory cells is increased from the second voltage to the program voltage.

25. The method of claim 20, further comprising:
increasing a voltage applied to an unselected control-gate plate of the first block of memory cells from the first voltage to the second voltage, starting at the first initial time; and
increasing a voltage applied to an unselected control-gate plate of the second block of memory cells from the first voltage to the second voltage, starting at the second initial time.

26. The method of claim 25, wherein the voltage applied to the unselected control-gate plate of the first block of memory cells is increased from the first voltage to the second voltage at a higher rate than the voltage applied to the unselected control-gate plate of the second block of memory cells is increased from the first voltage to the second voltage.

27. The method of claim 26, wherein the second voltage is a pass voltage.

28. The method of claim 20, wherein increasing the voltage applied to the selected control-gate plate of the first block of memory cells from the first voltage to the second voltage comprises applying a first current to the selected control-gate plate of the first block of memory cells, and wherein increasing the voltage applied to the selected control-gate plate of the second block of memory cells from the first voltage to the second voltage comprises applying a second current to the selected control-gate plate of the second block of memory cells that is greater than first current applied to the selected control-gate plate of the first block of memory cells.

29. The method of claim 20, wherein increasing the voltage applied to the selected control-gate plate of the first block of memory cells from the second voltage to the program voltage comprises applying a first current to the selected control-gate plate of the first block of memory cells, and wherein increasing the voltage applied to the selected control-gate plate of the second block of memory cells from the second voltage to the program voltage comprises applying a second current to the selected control-gate plate of the second block of memory cells that is greater than first current applied to the selected control-gate plate of the first block of memory cells.

30. A method of reading memory cells, comprising:
increasing a voltage applied to a selected control-gate plate of a first block of memory cells from a first voltage to a read voltage, starting at a first initial time;
latching data read from the first block of memory cells in response to the read voltage, starting at a second time that is a first length of time after the first initial time;
increasing a voltage applied to a selected control-gate plate of a second block of memory cells from the first voltage to the read voltage, starting at a second initial time; and
latching data read from the second block of memory cells in response to the read voltage, starting at a third time that is a second length of time after the second initial time;
wherein the first length of time is shorter than the second length of time.

31. The method of claim 30, wherein latching data read from the first block of memory cells comprises activating a sense amplifier latch, and wherein latching data read from the second block of memory cells comprises activating the sense amplifier latch.

32. The method of claim 31, further comprising:
outputting the latched data read from the first block of memory cells in response to the read voltage at a third length of time after the first initial time; and
outputting the latched data read from the second block of memory cells in response to the read voltage at a fourth length of time after the second initial time.

33. The method of claim 30, wherein the voltage applied to the selected control-gate plate of the first block of memory cells is increased from the first voltage to the read voltage at a higher rate than the voltage applied to the selected control-gate plate of the second block of memory cells is increased from the first voltage to the read voltage.

34. The method of claim 30, further comprising:
increasing a voltage applied to an unselected control-gate plate of the first block of memory cells from the first voltage to a pass voltage, starting at the first initial time; and
increasing a voltage applied to an unselected control-gate plate of the second block of memory cells from the first voltage to the pass voltage, starting at the second initial time.

35. The method of claim 34, wherein the voltage applied to the unselected control-gate plate of the first block of memory cells is increased from the first voltage to the pass voltage at a higher rate than the voltage applied to the selected control-gate plate of the second block of memory cells is increased from the first voltage to the pass voltage.

36. The method of claim 30, wherein increasing the voltage applied to the selected control-gate plate of the first block of memory cells from the first voltage to the read voltage comprises applying a first current to the selected control-gate plate of the first block of memory cells, and wherein increasing the voltage applied to the selected control-gate plate of the second block of memory cells from the first voltage to the read voltage comprises applying a second current to the selected control-gate plate of the second block of memory cells that is greater than first current applied to the selected control-gate plate of the first block of memory cells.

37. A memory device, comprising:
memory cells organized in a plurality of blocks of memory cells; and
control logic configured to cause the memory device to perform a method of programming the memory cells, comprising:
increasing a voltage applied to a selected control-gate plate of a first block of memory cells of the plurality of blocks of memory cells from a first voltage to a second voltage, starting at a first initial time, and increasing the voltage applied to the selected control-gate plate of the first block of memory cells from the second voltage to a program voltage, starting at a second time that is a first length of time after the first initial time; and
increasing a voltage applied to a selected control-gate plate of a second block of memory cells of the plurality of blocks of memory cells from the first voltage to the second voltage, starting at a second initial time, and increasing the voltage applied to the selected control-gate plate of the second block of memory cells from the second voltage to the program voltage, starting at a third time that is a second length of time after the second initial time;
wherein the first length of time is shorter than the second length of time.

38. A memory device, comprising:
memory cells organized in a plurality of blocks of memory cells; and
control logic configured to cause the memory device to perform a method of reading the memory cells, comprising:
increasing a voltage applied to a selected control-gate plate of a first block of memory cells of the plurality of blocks of memory cells from a first voltage to a read voltage, starting at a first initial time;
latching data read from the first block of memory cells in response to the read voltage starting at a second time that is a first length of time after the first initial time;
increasing a voltage applied to a selected control-gate plate of a second block of memory cells of the plurality of blocks of memory cells from the first voltage to the read voltage, starting at a second initial time; and
latching data read from the second block of memory cells in response to the read voltage, starting at a third time that is a second length of time after the second initial time;
wherein the first length of time is shorter than the second length of time.

* * * * *